United States Patent [19]
Klose

[11] Patent Number: 5,455,185
[45] Date of Patent: Oct. 3, 1995

[54] METHOD FOR MANUFACTURING A BIPOLAR TRANSISTOR HAVING BASE AND COLLECTOR IN A VERTICAL SEQUENCE

[75] Inventor: Helmut Klose, München, Germany

[73] Assignee: Siemens Aktiengesellschaft, Munich, Germany

[21] Appl. No.: 98,299

[22] PCT Filed: Jan. 27, 1992

[86] PCT No.: PCT/DE92/00045

§ 371 Date: Aug. 3, 1993

§ 102(e) Date: Aug. 3, 1993

[87] PCT Pub. No.: WO/9214267

PCT Pub. Date: Aug. 20, 1992

[30] Foreign Application Priority Data

Feb. 8, 1991 [DE] Germany .................... 41 03 898.3

[51] Int. Cl.⁶ ............................................. H01L 21/265
[52] U.S. Cl. .................... 437/31; 437/33; 437/164
[58] Field of Search .................................. 257/592, 518, 257/517, 588, 370; 437/164, 156, 149, 31, 33

[56] References Cited

U.S. PATENT DOCUMENTS 4,263,066   4/1981   Kolmann .................... 437/164
5,289,024   2/1994   Ganschow ................... 257/592

FOREIGN PATENT DOCUMENTS 0170250   2/1986   European Pat. Off. .
0409370   1/1991   European Pat. Off. .
53-135263  11/1978  Japan ........................ 437/164
55-8818    3/1980   Japan ........................ 437/164
56-47703   11/1981  Japan ........................ 437/164
58-141564  8/1983   Japan ........................ 257/592
1-134970   5/1989   Japan .
2081507    2/1982   United Kingdom .

OTHER PUBLICATIONS

"A Self–Aligned Poly–Emitter Bipolar Transistor," Sep. 1991, *Research Disclosure*, #329.

IBM Technical Disclosure Bulletin, vol. 29, No. 5, Oct. 1986.

"Punch–Through Guard Ring For Butted Transistor Emitters", pp. 2184–2185.

IBM Technical Disclosure Bulletin, vol. 27, No. 8, Jan. 1985, pp. 4931–4933.

Primary Examiner—Jerome Jackson
Assistant Examiner—Courtney A. Bowers
Attorney, Agent, or Firm—Hill, Steadman & Simpson

[57] ABSTRACT

In an epitaxial layer (3) deposited on a substrate (1), emitter (14), base (6) and collector (15) are disposed in a vertical sequence in such a way that the emitter (14) adjoins the surface of the epitaxial layer. Emitter (14) and base (6) are laterally bounded by an insulating zone (4, 8). The base (6) has, at the edge adjacent to the insulating zone, a base edge region (61) which is more heavily doped than the rest of the base (6). The base edge region (61) is produced, in particular, by outdiffusion from the borosilicate glass spacers (8) disposed on top of it.

4 Claims, 2 Drawing Sheets

METHOD FOR MANUFACTURING A BIPOLAR TRANSISTOR HAVING BASE AND COLLECTOR IN A VERTICAL SEQUENCE

BACKGROUND OF THE INVENTION

To increase the packing density in integrated circuits, so-called oxide edge-bounded bipolar transistors are being used more and more. Described as oxide edge-bounded bipolar transistor is a bipolar transistor whose emitter and base are bounded by an oxide edge at least on one side. The bipolar transistors have lower capacitances.

For the production, the oxide edge is produced on a substrate. After forming the base by ion implantation, a doped polysilicon layer, from which the emitter is produced by outdiffusion, is produced on the surface of the substrate and the oxide edge. Before the polysilicon layer is deposited, the surface of the substrate has to be pretreated, for example, by an HF dip. This process results in thinning of the base at the oxide edge. In the case of very shallow emitter-base profiles, in particular, this results in reduced emitter-collector yields and emitter-collector breakdown voltages in the finished bipolar transistor.

Since bipolar transistors which are not oxide edge-bounded have hitherto generally been used in bipolar technology, no solution to this problem is to be found in the prior art. Known bipolar transistors, such as are described, for example, in European reference EP-A-0 170 250, have an active transistor zone which is defined by the geometry of the base connection disposed at the surface of the substrate. An inactive base which surrounds both the active base and the emitter in an annular manner is formed in the substrate by outdiffusion from the base connection region. The problem of a reduced emitter-collector breakdown voltage does not therefore occur in these bipolar transistors.

SUMMARY OF THE INVENTION

The invention is based on the problem of providing a bipolar transistor structure having a base-emitter structure which is bounded by an insulating zone and which has increased emitter-collector breakdown voltage and improved emitter-collector yield, and also of providing a process for producing it.

In general terms the present invention is a bipolar transistor structure having the following features. The emitter, base and collector are disposed in a vertical sequence in a semiconductor epitaxial layer deposited on a semiconductor substrate in such a way that the emitter adjoins the surface of the semiconductor epitaxial layer. An emitter connection at least partially spanning the emitter is disposed on the surface of the semiconductor epitaxial layer. The emitter and the base, which have an active base, an inactive base and a base edge region, are bounded, at least on one side, by a common insulating zone. The base has a dopant profile parallel to the surface of the semiconductor substrate which is such that, at that edge of the base which is adjacent to the insulating zone, the base edge region is disposed which is more heavily doped than the rest of the base and which adjoins only the emitter, the emitter connection and the collector in addition to the insulating zone and the rest of the base.

The semiconductor substrate and the semiconductor epitaxial layer are monocrystalline silicon and the insulating zone contains $SiO_2$.

The bipolar transistor of the present invention also has the following features. The insulating zone contains at least a first component and a second component. The first component projects in height above the level of the surface of the semiconductor epitaxial layer in the region of the emitter and has an edge which faces the emitter and the base and which does not extend parallel to the surface of the semiconductor substrate and which converges on the surface of the semiconductor substrate. The second component is disposed as edge covering (spacer) at the edge of the first component above the base edge region and is a doped insulating material, with the result that it is suitable as a diffusion source for the formation of the base edge region.

The second component of the insulating structure is borosilicate glass.

A process of the present invention for producing the bipolar transistor structure having emitter, base and collector contained in the vertical sequence in the semiconductor epitaxial layer deposited on the semiconductor substrate, the emitter being adjacent to the surface of the semiconductor epitaxial layer and the emitter connection that at least partially spans the emitter being disposed on the surface of the semiconductor epitaxial layer, and the base having an active base, an inactive base and a base edge region, has the following steps:

- an insulating structure is produced which bounds the base and the emitter at least on one side and has an edge on this side, which edge does not extend parallel to the surface of the substrate; after a doping step to form the active base and prior to the formation of the emitter connection an edge covering that is composed of a doped insulating material and that is doped with the same conductivity type as the active base, is produced at the edge; and
- a base edge region which is more highly doped than the rest of the base is produced by outdiffusion from the edge covering.

The emitter connection is formed by producing a doped polycrystalline silicon layer of the conductivity type of the emitter over the entire surface and subsequently patterning it.

The edge covering is formed by conformal deposition of a layer of the insulating material over the entire surface and then anisotropically back-etching it.

The edge cover is formed from boron-doped glass.

In the bipolar transistor structure according to the invention, the emitter-collector dielectric strength and emitter-collector yield is markedly increased by introducing a base edge region which is more heavily doped than the rest of the base and is disposed at that edge of the base which is adjacent to the insulating zone.

It is within the scope of the invention that the insulating zone contains a first component and a second component. The first component projects in height above the level of the surface of the substrate in the region of the emitter and has one edge which faces the emitter and the base and which does not extend in parallel with the surface of the substrate. This first component of the insulating zone is produced, for example, in a LOCOS process, in particular in the coplanar process.

The second component is disposed at the edge of the first component as edge covering (spacer). The edge covering is disposed above the base edge region. It is a doped insulating material, with the result that it is suitable as diffusion source for the formation of the base edge region. Suitable doped insulating material is, for example, borosilicate glass. In this embodiment, the base edge region is formed so as to be self-aligned with the insulating region at the edge of the base since the edge covering can be produced in a self-aligned manner with the aid of a spacer technology at the edge of the first component of the insulating zone.

In the production of the bipolar transistor according to the invention, the surface treatment prior to the deposition of a doped polycrystalline silicon layer to produce the emitter connection does in fact also result in an erosion of the exposed surface, but since the base is reinforced at the edge by the base edge region, thinning of the base and, consequently, a weak point for the emitter-collector dielectric strength are avoided.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENT

Figure 1:
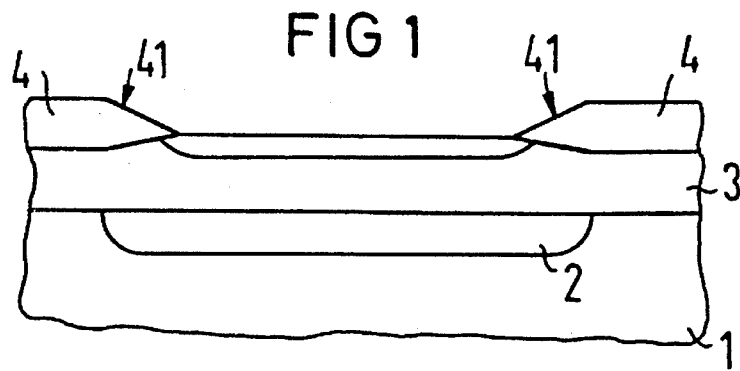
FIG. 1 to FIG. 4 show production steps for a bipolar transistor structure according to the invention, whose base-emitter structure is bounded at opposite sides by an oxide edge.

In a silicon substrate 1, which is, for example, p-doped, a buried collector layer 2 is produced, after suitable masking, by ion implantation using, for example, arsenic or antimony (see FIG. 1).

An n-doped epitaxial layer 3 is deposited on the surface of the substrate containing the buried collector layer 2. The epitaxial layer 3 has a resistivity of, for example, 1 ohm×cm.

Insulating structures 4 are then formed in a local oxidation process. The so-called coplanar process, which is a variant of the known LOCOS process, is, for example, suitable for this purpose. In the coplanar process, an additional polysilicon layer is introduced between the oxide and nitride layers used in the LOCOS process. The insulating structure 4 bounds at two opposite sides, that region of the surface of the epitaxial layer 3 in which emitter and base are subsequently produced. The insulating structure 4 projects in its height above the surface of the exposed silicon. The insulating structure 4 has edges 41 which converge on the exposed surface of the silicon.

Figure 6:
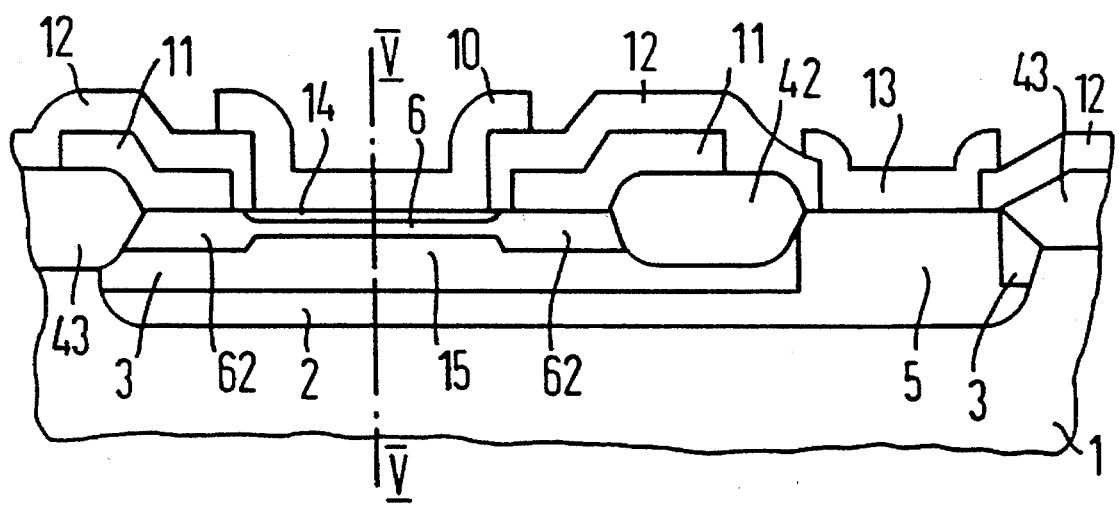
FIG. 6 shows the section denoted by VI—VI in FIG. 5 through the bipolar transistor structure.

After the other regions have been masked, a deep collector connection 5 is produced by ion implantation and subsequent diffusion (see FIG. 6). The deep collector connection 5 is disposed laterally with respect to the active transistor region. It is insulated from the active transistor region by an insulating structure 42 and extends from the surface of the epitaxial layer 3 to the buried collector layer 2.

After the appropriate regions have been masked, an active base 6 is produced inside the insulating structure 4 by ion implantation, for example, using boron with an energy of 15 keV and a dose of $3\times10^{-13}$ cm$^{-2}$ (see FIG. 1).

Figure 2:
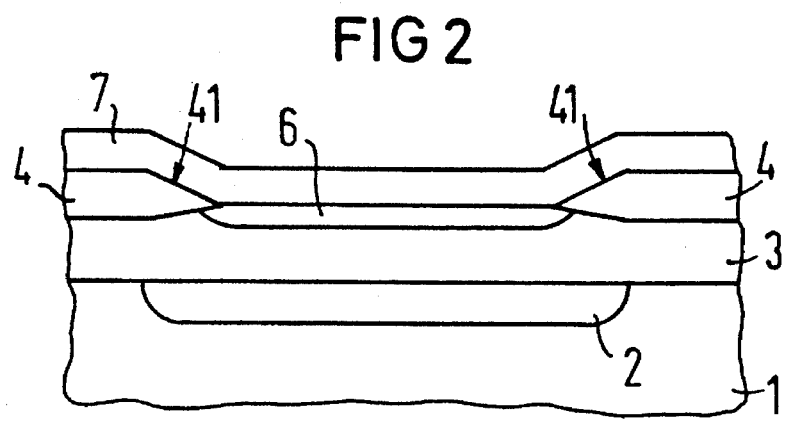

There follows the conformal deposition of an insulating layer 7, for example of borosilicate glass, over the entire surface (see FIG. 2). The deposition of the insulating layer 7 is carried out, for example, from boron glass in a deposition tube by deposition from the gas phase at low pressure (low-pressure chemical vapor deposition, LPCVD). In this process, tristrimethylsilyl borate $B(OSi(CH_3)_3)_3$ is passed into the deposition tube with $O_2$ added.

Figure 3:
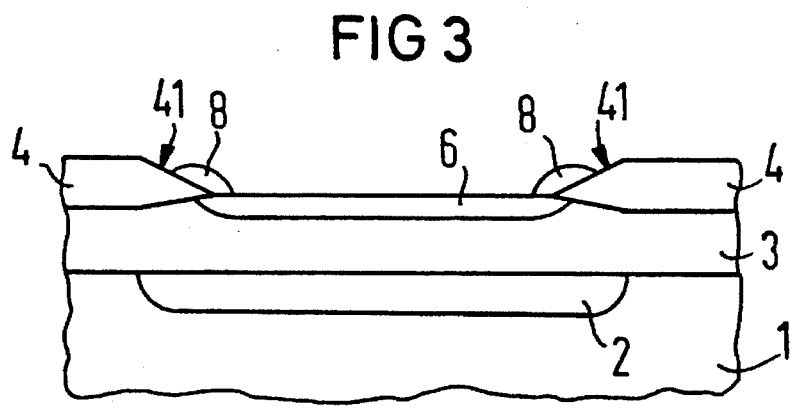

Edge coverings (spacers) 8 are produced by anisotropic back-etching, for example with $CHF_3$. The edge coverings 8 are boron-doped. They are suitable as diffusion source (see FIG. 3).

The dopant, boron, is outdiffused from the edge coverings 8 with the aid of a heat treatment at, for example, 900° C. for, for example, 15 minutes. In this process, the doping is locally increased at edges of the active base 6 which are adjacent to the edges 41. This results in the formation of base edge regions 61 (see FIG. 4).

A base connection 11 (see FIG. 6) is then produced in a known manner. For this purpose, a p-doped polysilicon layer is deposited and then patterned in such a way that the active base 6 is laterally connected via an inactive base 62 by the base connection 11. The base connection 11 is disposed at those sides of the base 6 at which the active base 6 is not bounded by the insulating structure 4. The base connection 11 is covered by depositing and back-etching an insulating layer 12. The insulating layer 12 leaves the surface of the active base 6 and of the deep collector connection 5 uncovered.

Figure 4:
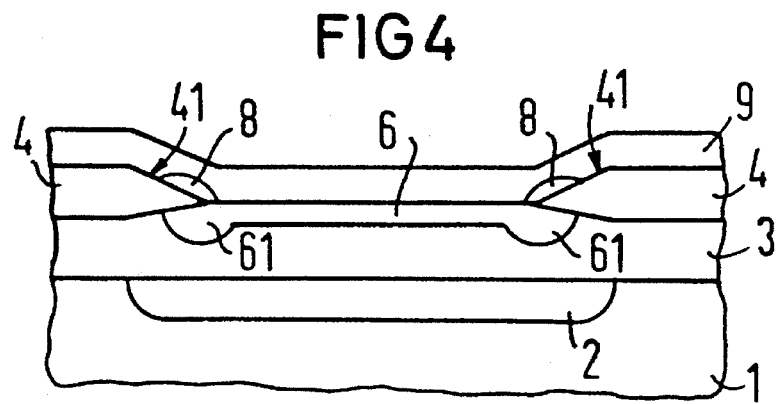

A n-doped polysilicon layer 9 is then deposited over the entire surface (see FIG. 4). An emitter connection 10 which spans that silicon region which is bounded by the edge coverings 8 and the insulating layer 12, is then formed (see FIG. 5 and FIG. 6) from the n-doped polysilicon layer 9 by patterning. A collector connection 13 (see FIG. 6) is furthermore formed from the n-doped polysilicon layer 9 during the patterning.

In a heat-treatment step at, for example, 1,050° C. for 10 sec., an emitter 14 is formed above the active base 6 by outdiffusion from the emitter connection 10.

Collector 15 of the bipolar transistor structure (see FIG. 5 and FIG. 6) is formed by that part of the epitaxial layer 3 which is disposed immediately underneath the active base 6. The collector 15 is connected to the collector connection 13 via the buried collector layer 2 and the deep collector connection 3 (see FIG. 6). The base edge regions 61 ensure that a short circuit via the edge of the active base 6 is prevented between the emitter 14 and the collector 15 (see FIG. 5).

Figure 5:
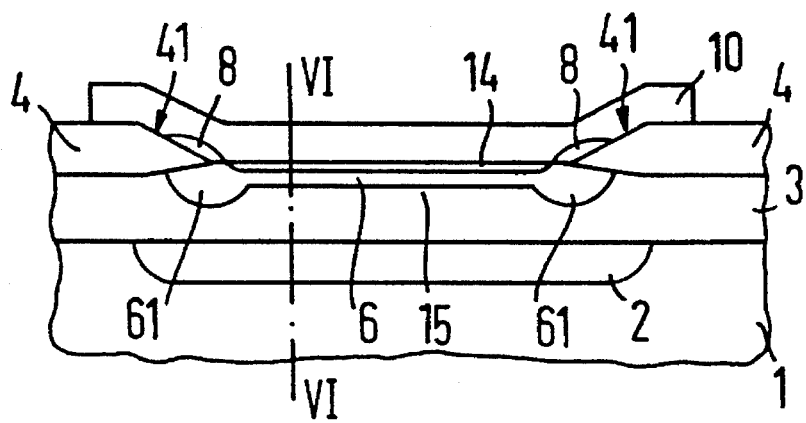
FIG. 5 shows the finished bipolar transistor structure.

FIG. 5 shows the section, denoted by V—V in FIG. 6, through the bipolar transistor structure. FIG. 6 shows the section denoted by VI—VI in FIG. 5, through the bipolar transistor structure. The bipolar transistor structure shown in FIG. 6 is described as inner-spacer transistor /PSA. In FIG. 6, the reference symbol 42 denotes an insulating structure which isolates the deep collector connection 13 from the active transistor regions 6, 14, 15. The reference symbol 43 denotes an insulating structure which insulates the bipolar transistor in substrate 1 and the epitaxial layer 3 from adjacent circuit elements.

The production process is completed in a known manner by depositing a passivating layer, contact via opening and contact metallization over the entire surface.

Figure 7:
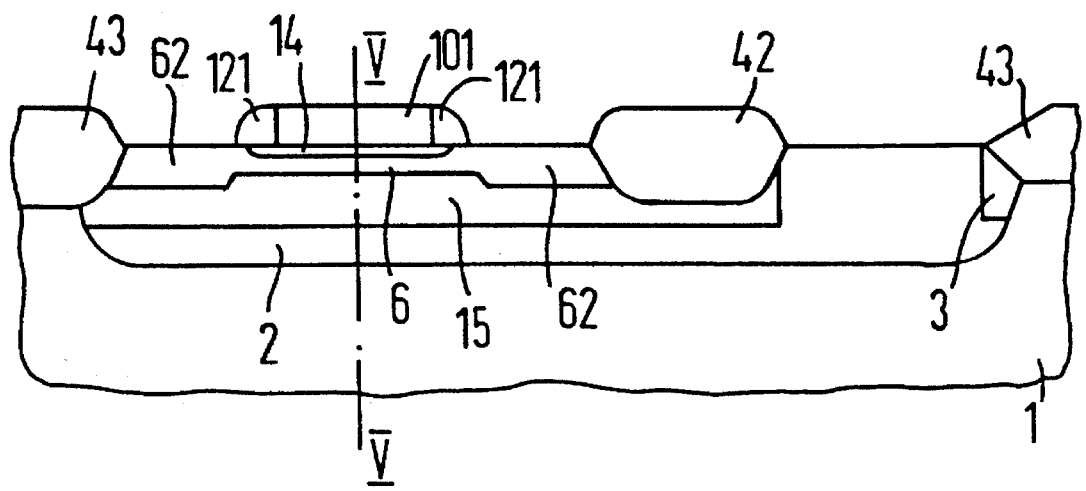
FIG. 7 shows a section through an outer-spacer transistor.

FIG. 7 shows a further possible embodiment of the bipolar transistor structure according to the invention. It differs from the one shown in FIG. 6 in that an emitter connection 101 composed, for example, of n-doped polysilicon is laterally bounded on the outside by edge coverings 121. The emitter 14 is produced by outdiffusion from the emitter connection 101. The inactive base 62 is produced, for example, by implantation between the insulating structures 42, 43 and the edge coverings 121 in such a way that it makes contact laterally with the active base 6. This bipolar transistor structure is described as outer-spacer transistor. The section denoted by V—V in FIG. 7 is identical to that shown in FIG. 5.

The invention is not limited to the particular details of the method and apparatus depicted and other modifications and applications are contemplated. Certain other changes may be made in the above described method and apparatus without departing from the true spirit and scope of the invention herein involved. It is intended, therefore, that the subject matter in the above depiction shall be interpreted as illustrative and not in a limiting sense.

What is claimed is:

1. A method for manufacturing a bipolar transistor, comprising the steps of:

producing a silicon substrate having a surface; producing a buried collector in the silicon substrate; producing an insulation structure at the surface of the silicon substrate, said insulation structure limiting an active transistor region at two opposite sides with sidewalls projecting above the surface of the substrate; producing an active base by ion implantation of boron inside the insulation structure;

depositing an insulation layer of borosilicate glass; forming spacers from the insulation layer by anisotropic re-etching, said spacers being arranged at the sidewalls that limit the active transistor region, the surface of the active base being uncovered between the spacers;

producing base edge regions that are arranged between the active base and the sidewalls of the insulation structure by drive-out from the spacers;

forming a base terminal by deposition and structuring of a p-doped polysilicon layer;

producing an inactive base that adjoins the active base at sides that are transversely arranged relative to the base edge regions by drive-out from the base terminal;

covering the base terminal with an insulating layer; and forming an emitter terminal and forming an emitter by drive-out from the emitter terminal.

2. The method according to claim 1, wherein the insulation layer of borosilicate glass is produced by Low-Pressure Chemical Vapor Deposition using a process gas containing tristrimethylsilylborate ($B(OSi(C_3H_3)_3)_3$) and oxygen ($O_2$).

3. The method according to claim 2, wherein the anisotropic re-etching for forming the spacers ensues with $CHF_3$.

4. The method according to claim 1, wherein the emitter terminal is formed by deposition and structuring of an n-doped polysilicon layer.

* * * * *